United States Patent [19]

Houseman

[11] Patent Number: 4,513,368
[45] Date of Patent: Apr. 23, 1985

[54] DIGITAL DATA PROCESSING SYSTEM HAVING OBJECT-BASED LOGICAL MEMORY ADDRESSING AND SELF-STRUCTURING MODULAR MEMORY

[75] Inventor: David L. Houseman, Cary, N.C.

[73] Assignee: Data General Corporation, Westboro, Mass.

[21] Appl. No.: 266,414

[22] Filed: May 22, 1981

[51] Int. Cl.³ .............................................. G06F 4/36
[52] U.S. Cl. .................................................. 364/200
[58] Field of Search ............................... 364/200, 900

[56] References Cited

U.S. PATENT DOCUMENTS

| 3,599,186 | 5/1970 | May et al. | 364/200 |
| 3,781,808 | 12/1973 | Ahearn et al. | 364/200 |
| 3,848,234 | 11/1974 | MacDonald | 364/200 |
| 4,215,407 | 7/1980 | Gomola et al. | 364/200 |
| 4,236,206 | 11/1980 | Strecker et al. | 364/200 |
| 4,355,355 | 10/1982 | Butwell et al. | 364/200 |

Primary Examiner—Jerry Smith
Assistant Examiner—Michael R. Fleming
Attorney, Agent, or Firm—Gerald Cechony; Joel Wall

[57] ABSTRACT

A digital computer system in which the memory is structured into objects, which are blocks of storage of arbitrary length, in which the data items are accessed by specifying the desired object and the desired data item's offset into that object. The memory controls accommodate any number of memory arrays of any size, automatically transforming the addresses to present the appearance of a single unified memory bank.

2 Claims, 2 Drawing Figures

DIGITAL DATA PROCESSING SYSTEM HAVING OBJECT-BASED LOGICAL MEMORY ADDRESSING AND SELF-STRUCTURING MODULAR MEMORY

CROSS REFERENCE TO RELATED APPLICATIONS

The present patent application is related to other patent applications assigned to the assignee of the present application.

BACKGROUND OF THE INVENTION

1. Field of the Invention

The present invention relates to a digital data processing system and, more particularly, to a multiprocess digital data processing system suitable for use in a data processing network and having a simplified, flexible user interface and flexible, multileveled internal mechanisms.

2. Description of Prior Art

A general trend in the development of data processing systems has been towards systems suitable for use in interconnected data processing networks. Another trend has been towards data processing systems wherein the internal structure of the system is flexible, protected from users, and effectively invisible to the user and wherein the user is presented with a flexible and simplified interface to the system.

Certain problems and shortcomings affecting the realization of such a data processing system have appeared repeatedly in the prior art and must be overcome to create a data processing system having the above attributes. These prior art problems and limitations include the following topics.

First, the data processing systems of the prior art have not provided a system wide addressing system suitable for use in common by a large number of data processing systems interconnected into a network. Addressing systems of the prior art have not provided sufficiently large address spaces and have not allowed information to be permanently and uniquely identified. Prior addressing systems have not made provisions for information to be located and identified as to type or format, and have not provided sufficient granularity. In addition, prior addressing systems have reflected the physical structure of particular data processing systems. That is, the addressing systems have been dependent upon whether a particular computer was, for example, an 8, 16, 32, 64 or 128 bit machine. Since prior data processing systems have incorporated addressing mechanisms wherein the actual physical structure of the processing system is apparent to the user, the operations a user could perform have been limited by the addressing mechanisms. In addition, prior processor systems have operated as fixed word length machines, further limiting user operations.

Prior data processing systems have not provided effective protection mechanisms preventing one user from effecting another user's data and programs without permission. Such protection mechanisms have not allowed unique, positive identification of users requesting access to information, or of information, nor have such mechanisms been sufficiently flexible in operation. In addition, access rights have pertained to the users rather than to the information, so that control of access rights has been difficult. Finally, prior art protection mechanisms have allowed the use of "Trojan Horse arguments". That is, users not having access rights to certain information have been able to gain access to that information through another user or procedure having such access rights.

Yet another problem of the prior art is that of providing a simple and flexible interface user interface to a data processing system. The character of user's interface to a data processing system is determined, in part, by the means by which a user refers to and identifies operands and procedures of the user's programs and by the instruction structure of the system. Operands and procedures are customarily referred to and identified by some form of logical address having points of reference, and validity, only within a user's program. These addresses must be translated into logical and physical addresses within a data processing system each time a program is executed, and must then be frequently re-translated or generated during execution of a program. In addition, a user must provide specific instructions as to data format and handling. As such reference to operands or procedures typically comprise a major portion of the instruction stream of the user's program and requires numerous machine translations and operations to implement. A user's interface to a conventional system is thereby complicated, and the speed of execution of programs reduced, because of the complexity of the program references to operands and procedures.

A data processing system's instruction structure includes both the instructions for controlling system operations and the means by which these instructions are executed. Conventional data processing systems are designed to efficiently execute instructions in one or two user languages, for example, FORTRAN or COBAL. Programs written in any other language are not efficiently executable. In addition, a user is often faced with difficult programming problems when using any high level language other than the particular one or two languages that a particular conventional system is designed to utilize.

Yet another problem in conventional data processing systems is that of protecting the system's internal mechanisms, for example, stack mechanisms and internal control mechanisms, from accidental or malicious interference by a user.

Finally, the internal structure and operation of prior art data processing systems have not been flexible, or adaptive, in structure and operation. That is, the internal structure and operation of prior systems have not allowed the systems to be easily modified or adapted to meet particular data processing requirements. Such modifications may include changes in internal memory capacity, such as the addition or deletion of special purpose subsystems, for example, floating point or array processors. In addition, such modifications have significantly effected the users interface with the system. Ideally, the actual physical structure and operation of the data processing system should not be apparent at the user interface.

The present invention provides data processing system improvements and features which solve the above-described problems and limitations.

SUMMARY OF THE INVENTION

The present invention relates generally to digital computer systems and more specifically to digital computer systems employing object-based addressing of data. The digital computer system of the present invention includes a memory system having mass storage devices and one or more processors connected to the memory system.

The memory system is logically organized into objects, which are variable-length blocks of storage containing data items. Each data item is identified by a logical address which specifies the object in which that data item is to be found, and an offset specifying how far into that object that data item begins.

The memory controls permit physically organizing the memory into any number of memory arrays where the arrays may be of any size. The memory controls receive the aforementioned logical address from the processing means and transform it to the appropriate physical address within the appropriate one of the memory arrays in order to access the desired data item, thus presenting the appearance of a single unified memory bank.

It is thus an object of the present invention to provide an improved data processing system.

It is another object of the present invention to provide a data processing system capable of use in large, interconnected data processing networks.

It is yet another object of the present invention to provide an improved addressing mechanism suitable for use in large, interconnected data processing networks.

It is still another object of the present invention to provide a simplified and flexible user interface to a data processing system.

It is yet a further object of the present invention to provide an improved mechanism for referring to operands.

It is a further object of the present invention to provide data processing internal mechanisms protected from user interference.

It is yet another object of the present invention to provide a data processing system having a flexible internal structure capable of multiple, concurrent operations.

Other objects, advantages and features of the present invention will be understood by those of ordinary skill in the art, after referring to the following detailed description of the preferred embodiments and drawings wherein.

This application incorporates by reference the entire application, Ser. No. 266,402, filed on May 22, 1981, of Ward Baxter II et al.

Figure 2:
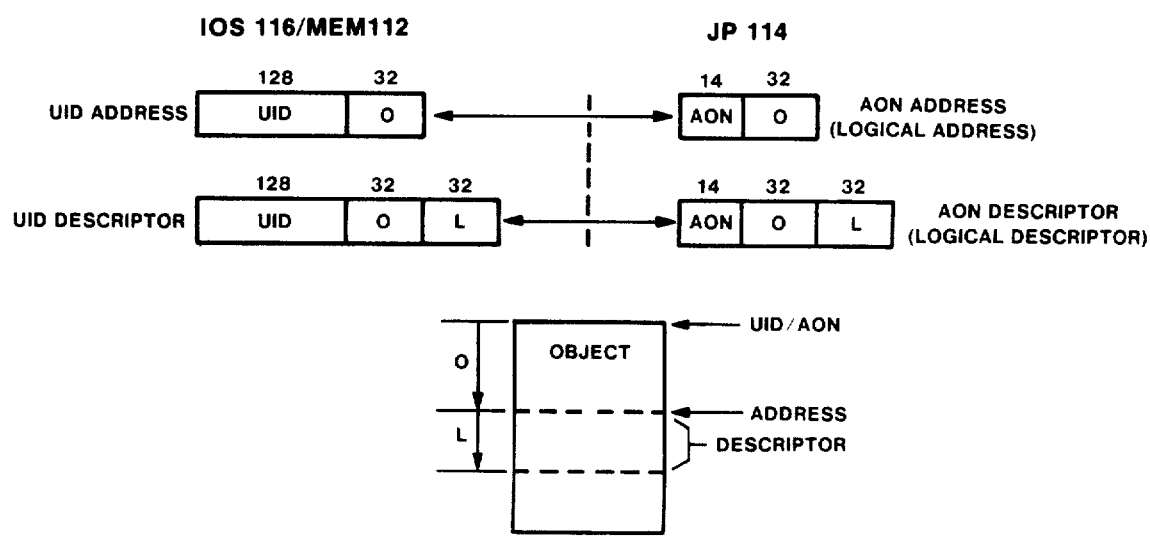
FIG. 2 is a diagram illustrating computer system addressing structure of the present invention.
Figure 18:
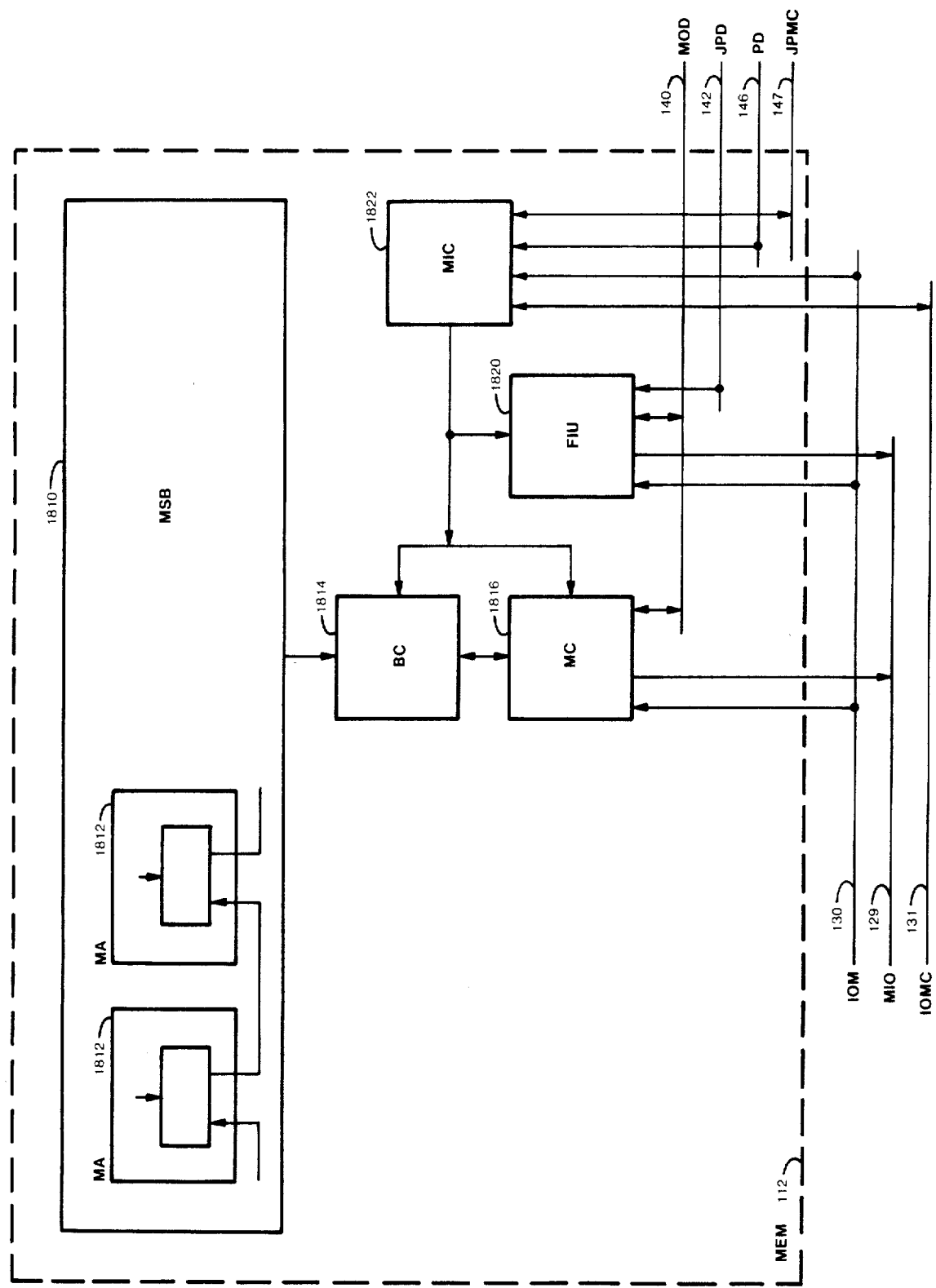
FIG. 18 is a partial block diagram of a memory system.

More particularly, attention is directed to FIGS. 2, 18, 19, 101, 102, 106c, 201, 202, and 270 of the drawings in application Ser. No. 266,402, and to that part of the specification, particularly at pages 165-189, 348-361, and 374-428 thereof, which relate to subject matter of the claims herein.

Although the claims contain parenthetical references to portions of the Figures, it is to be understood that these references are not the only references relating to or supporting these claims.

What is claimed is:

1. A memory for use in a digital data system, comprising:

memory bank means (MSB 1810) comprising a plurality of memory array means (MA 1812) for storing data, memory control means (MIC 1822, BC 1814) connected from certain portions (ATU 10228 via PD 10146, FIGS. 270 & 18) of said data system for receiving first addresses for controlling operation of said memory, for providing second addresses corresponding to said first addresses for controlling said memory bank means, said second addresses representing storage locations for said data in said memory bank means, and for conducting said data between said memory bank means and said certain portions of said digital data system, and memory array bus means (within MSB 1810) connected from said memory control means and to each one of said plurality of memory array means in parallel for conducting said data and said second addresses between said memory control means and each one of said plurality of memory array means, each one of said plurality of memory array means comprising data storage means connected from said memory array bus means for storing said data, and memory array address means connected from said memory array bus means and responsive to said second addresses for controlling said data storage means, said memory array address means including adaptive address means (A within MA 1812), the adaptive address means comprising means for indicating data storage capacity of said data storage means, address range indicating means for:

(1) receiving from the memory control means a minimum address which the address range indicating means assigns to the lowest storage location within the corresponding memory array means, and (2) adding said data storage capacity to said minimum address to produce the address of the highest storage location within the memory array means, and, address comparison means for initiating operation of said memory array address means when one of the said second addresses occurs in the range between said lowest storage location within the corresponding memory array means and said highest storage location within the memory array means.

2. A digital data processing system including:

memory means (MSB 1810) for storing the data organized as operands and instructions which specify operations to be performed on the operands, processing means (JP 114) responsive to the instructions for performing the operations on the operands, memory control means (MIC 1822) responsive to memory addresses for accessing the data in the memory means, bus means (MOD 140, JPD 142, PD 146, JPMC 147) for conducting the data between the memory means and the processing means, and address means (ATU 1928) for providing the memory addresses to the memory control means, the address means comprising:

means (Parser 1964, Name Cache 1926) for receiving logical addresses from the instructions executing in the processing means, the logical addresses comprising:

a first number denoting a certain one of a plurality of variable-length blocks of data, and a second number denoting an offset from the beginning of said certain block to a certain operand;

means (ATU 1928) for translating each of the logical addresses to its corresponding memory address by translating said second number into a memory page number and an offset within that page, and translating said first number and said page number to yield a memory frame number, said memory frame number and said offset together comprising said memory address (FIG. 106c), and means (PD 146) connected from said address means to said memory control means for forwarding said memory addresses to the memory control means, whereby the memory means may be logically organized as a plurality of variable-length blocks of data, and the instructions may identify each operand by a logical address indicating a block and an offset within that block.

* * * * *